(12) United States Patent
Badiali

(10) Patent No.: US 6,854,328 B2
(45) Date of Patent: Feb. 15, 2005

(54) COVER STRUCTURE FOR MARINE INSTRUMENT

(75) Inventor: John A. Badiali, Englewood, FL (US)

(73) Assignee: Custom Spec Engineering, Inc., W. Bridgewater, MA (US)

( * ) Notice: Subject to any disclaimer, the term of this patent is extended or adjusted under 35 U.S.C. 154(b) by 349 days.

(21) Appl. No.: 10/172,202

(22) Filed: Jun. 13, 2002

(65) Prior Publication Data

US 2002/0189348 A1 Dec. 19, 2002

Related U.S. Application Data

(60) Provisional application No. 60/298,267, filed on Jun. 14, 2001.

(51) Int. Cl.$^7$ ................................................ G12B 9/00
(52) U.S. Cl. ...................................... 73/431; 248/27.1
(58) Field of Search ............................... 73/431, 866.3; 455/347, 348, 349; 248/904, 27.1; D12/192; D14/257, 258

(56) References Cited

U.S. PATENT DOCUMENTS

| | | | |
|---|---|---|---|
| 4,584,717 A | * 4/1986 | Strickland ................... 455/345 |
| 4,628,732 A | * 12/1986 | Makinen ..................... 73/866.5 |
| 4,706,810 A | 11/1987 | Petrilli ........................ 206/320 |
| D300,020 S | 2/1989 | Petrilli ...................... D12/192 |
| D311,383 S | 10/1990 | Falck ......................... D13/177 |
| D333,307 S | 2/1993 | Sliper et al. ............... D14/258 |
| D339,787 S | 9/1993 | Badiali ...................... D12/317 |
| D405,040 S | 2/1999 | Badiali ...................... D12/192 |
| 5,865,403 A | 2/1999 | Covell ........................ 248/27.1 |
| 6,179,253 B1 | 1/2001 | Cotton ...................... 248/27.1 |
| 6,352,003 B1 | * 3/2002 | Erben ......................... 73/866.3 |

* cited by examiner

Primary Examiner—Robert Raevis
(74) Attorney, Agent, or Firm—Gifford, Krass, Groh, Sprinkle, Anderson & Citkowski, P.C.

(57) ABSTRACT

A cover or housing for marine instruments in which a rectangular opening giving access to the instrument is closed by a curved cover or door which rotates about the axis of the curves between open and closed positions. In its closed position are four edges of the rectangular opening are sealed relative to the cover to protect the instrument from air bourn sea spray or rain.

14 Claims, 4 Drawing Sheets

US 6,854,328 B2

COVER STRUCTURE FOR MARINE INSTRUMENT

This application claims the benefit of Provisional application Ser. No. 60/298,267 filed Jun. 14, 2001.

FIELD OF THE INVENTION

This invention relates to marine instruments and more particularly to a housing structure for such instruments to protect them from water such as rain and sea spray.

BACKGROUND OF THE INVENTION

Marine instruments such as two way radios, depth sounders, Global Positioning Systems (GPS), autopilots as well as components of stereo sound systems frequently are mounted at the control position of smaller boats and vessels so that they can be viewed and controlled by the pilot.

Although many of these instruments are intended to be waterproof it is still desirable and necessary to protect the face of the instruments from rainwater and sea spray. This necessitates a movable cover which must give access to the instrument controls and must protect the instrument from spray or rain when use of the controls is not required and at the same time make the instrument visible

SUMMARY OF THE INVENTION

Covers or housings for instruments have been provided in which a door or cover is curved and moves in a curved path about a horizontal axis so that the door rotates or swings down to close a rectangular opening and rotates upwardly when needed to expose the instrument controls. However, most of such housings rely on a decorative frame or bezel to overlap and cover the exposed edges between the moveable door and frame to prevent a direct path for the entry of spray. Some housings provide sealing at only the lower edge of the door and its mating lower edge of the frame and none of such housings appear to close and seal all four edges between the cover and its frame.

It is an object of the present invention to provide an instrument housing for instruments so that they can be protected from airborne moisture by a sealing arrangement which obstructs moisture entry and is effective at all edges of the moveable door relative to its frame.

It is another object of the invention to provide an instrument housing with a curved door having mating, sealing surfaces at all edges including the upper edge of the door and frame when the later is in a closed position.

The objects of the invention are attained by an instrument housing which is adapted for mounting in an opening in a wall, such as the bulkhead of a boat. The housing includes a mounting frame for supporting the selected instrument which is adapted for mounting in a fixed position in the opening in the wall. The mounting frame has a rectilinear opening which is opened and closed by a cover member having a curved surface shaped as a 90 degree segment of a cylinder wall with the axis extending parallel to the upper and lower edges of the opening in the frame and with the cover member rotating about the axis between opened and closed positions. A sealing flange is formed adjacent an upper edge of the cover member for complementary engagement with a sealing surface on the upper edge of the frame. Additional sealing is provided at the lower edge of the cover member and at its opposed side edges where mating curved surfaces with the frame are kept in sliding engagement with each other during movement toward and in the closed position.

DETAILED DESCRIPTION

Figure 1:
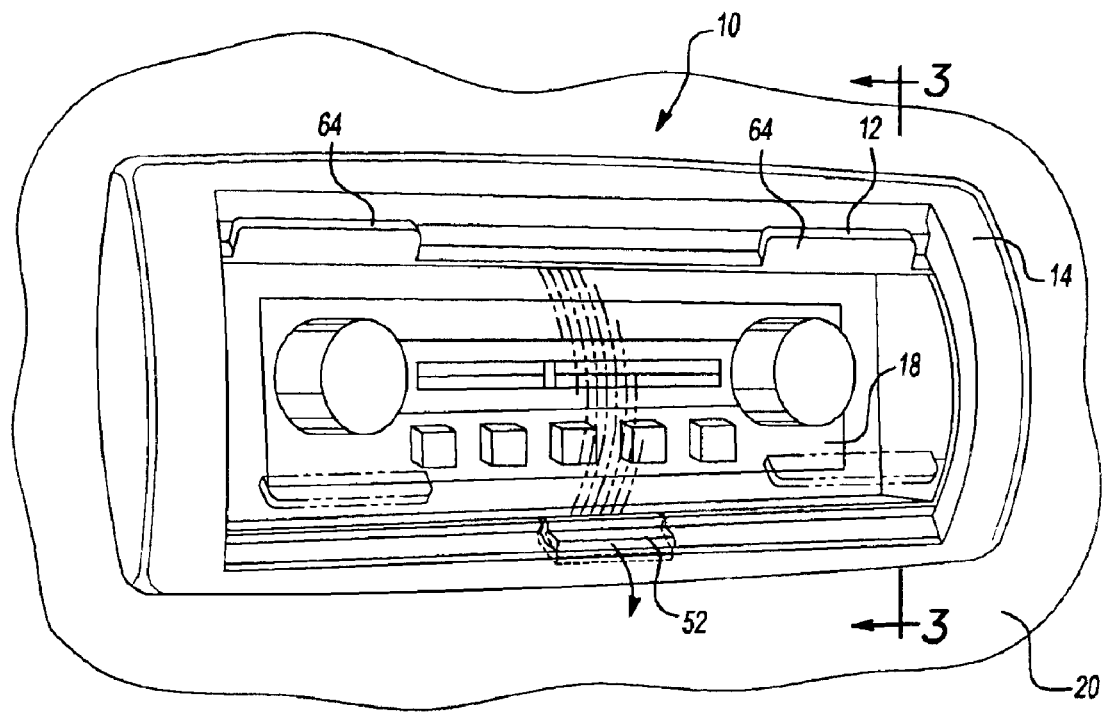
FIG. 1 is perspective view of the housing structure for marine instruments embodying the invention mounted in a bulkhead of a boat with the cover in its open position.

Referring to the drawings, the marine instrument housing structure embodying the invention is designated generally at 10, the face of which includes a hinged door or cover 12 surrounded by a bezel or frame member 14. The instrument cover assembly 10 also includes an instrument mounting bracket designated at 16 in FIG. 3 which supports marine instruments such as the radio depicted in FIGS. 1 and 2 at 18.

Figure 2:
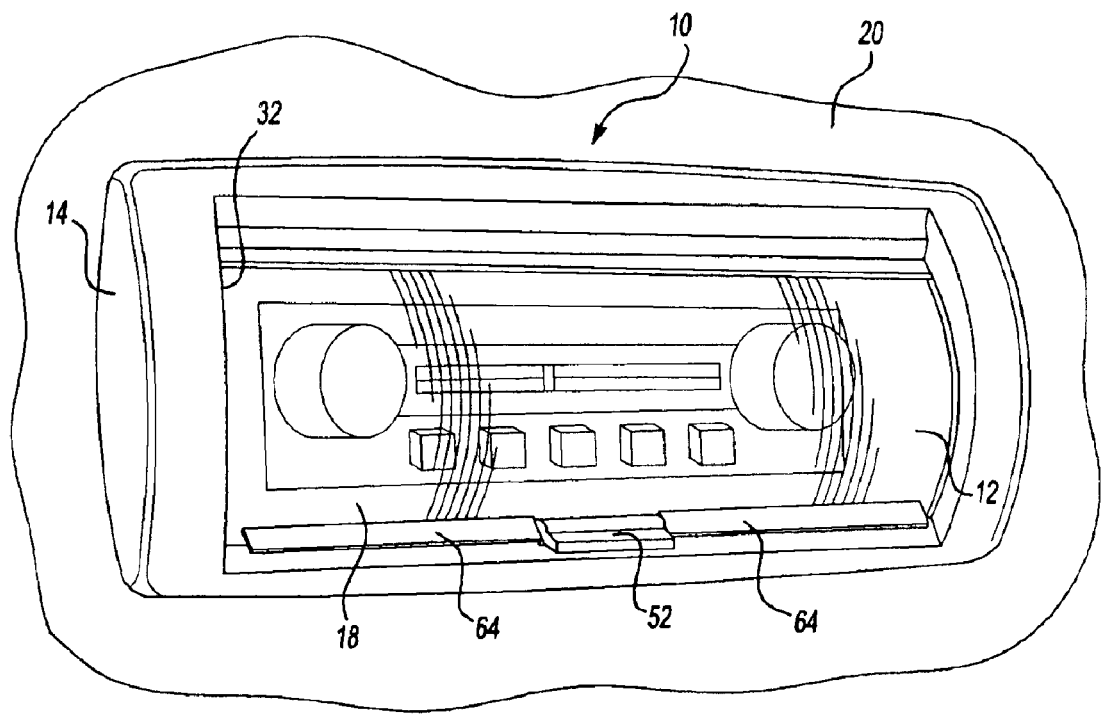
FIG. 2 is a view similar to FIG. 1 but showing the cover in its closed position.

The instrument housing structure 10, together with the supported marine instrument or radio 18 are supported in a boat from a generally vertical bulkhead or instrument panel board 20 shown partially in FIGS. 1 and 2.

Figure 3:
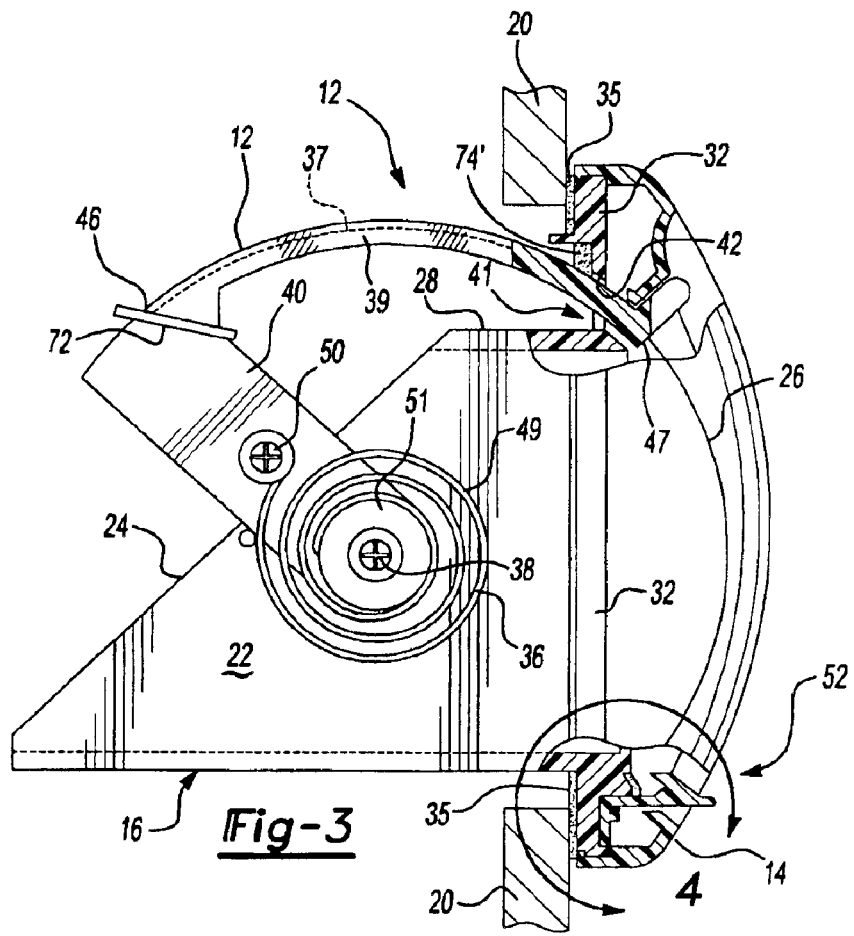
FIG. 3 is a cross-sectional view taken generally on line 3—3 in FIG. 1 and showing the cover in its open position.
Figure 7:
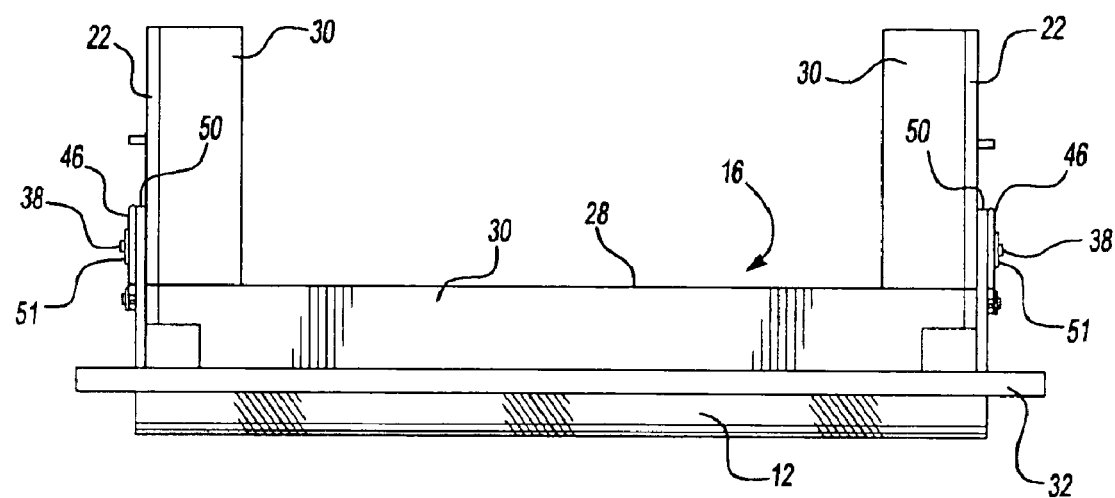
FIG. 7 is a top plan view of the housing structure in its closed position with the decorative frame removed.
Figure 8:
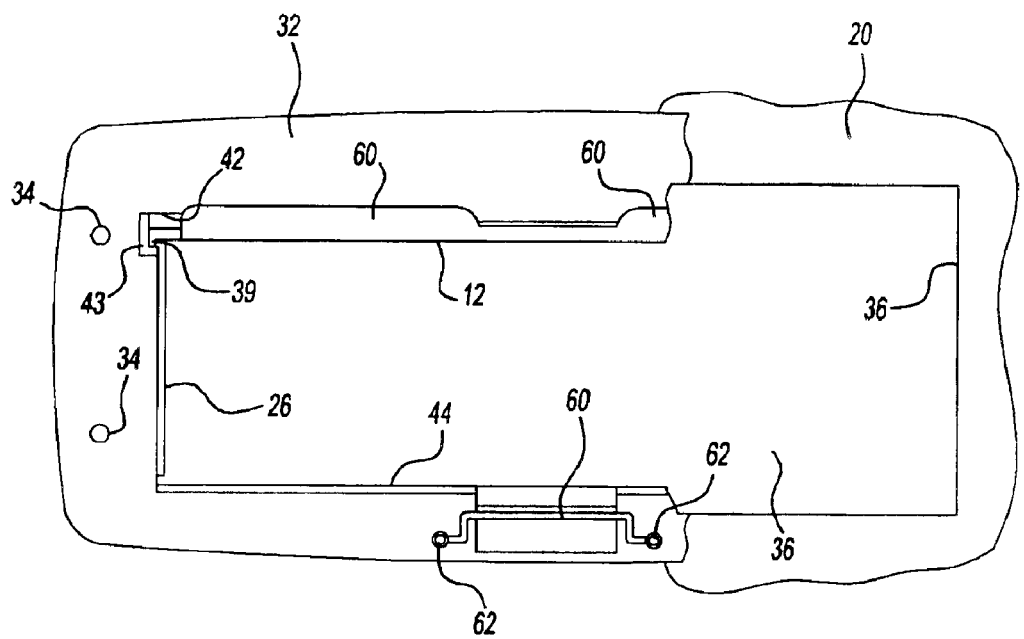
FIG. 8 is a front elevation of the cover structure in its closed position with part of the decorative frame broken away and removed.

Mounting bracket 16 forming part of the marine instrument housing structure 10 includes a pair of parallel spaced side walls 22 one of which can be seen in FIG. 3 and each has a rear angled edge 24 and a forward curved edge 26. The end walls 22 are held in a spaced apart relationship by an upper shelf member 28 and a lower C-shaped shelf 30 seen in FIG. 7. Shelf 30 extends along the bottom edges of the end walls 22 and between the end walls 22 and generally in parallel relation to the upper shelf 28. The mounting bracket 16 acts to support the marine instrument which usually is a two-way radio. The majority of such radios come in two sizes and the disclosed structure accommodates the largest as well as the smaller size. The sidewalls 22 also are held in spaced apart relationship by means of a rectangular front frame 32 as seen in FIGS. 7 and 8 which forms a mounting flange having screw holes 34 to receive mounting fasteners not shown. The mounting bracket 16 including the end walls 22 the upper shelf 28, lower shelf 30 and frame 32 are molded as an integral unit of plastic material. The back of the frame 32 is provided with a rectangular gasket 35 which acts as a seal between the frame and the mounting wall or bulkhead 20 of the vessel.

A rectangular opening 36 seen in FIG. 8 is formed by the frame 32 and receives a moveable and curved cover 12. The cover 12 is made of transparent plastic which can be clear or tinted. The outer wall 37 of the cover 12 is curved about an axis designated at 38 in FIGS. 3 and 5 and is a 90° segment of a cylindrical wall. Opposite ends of the cylindrical wall have a pair of parallel arms 40 integral with and extending radially from an upper edge of the outer wall 37 and pivoted to the sidewalls 22 at 38. The inner surface of outer wall 37 conforms to the curvature of the curved edge 26 of the end walls 22. Opposite ends of the wall 37 are provided with flanges or lips 39 extending radially from the outer wall 37 and remain closely spaced to the outer side of each of the end walls 22 as seen in FIG. 8.

During movement from open to closed position the curved outer wall 37 of cover 12 passes through an elongated slot 41 formed between upper shelf 28 and the upper horizontal edge portion 42 of frame 32 as best seen in FIG. 3. At the opposite ends, the slot 41 extends slightly downward at the outer sides of the sidewalls 22 as indicated at 43 in FIG. 8.

Also during such movement the inner surface of curved wall 37 remains in sliding engagement with the curved end edges 26 of end walls 22 so that in the closed position, the curved edges 26 and curved cover member are in closed abutting relationship. The abutting relationship is enhanced by the position of the arms 40 at the upper edge 46 so that the curved cylindrical segment is cantilevered from the arms 40 and the flexibility of the plastic allows the inner curved surface of cover member to be urged into engagement with the curved forward edges 26 of the frame walls 22.

In addition to the upper edge 42 of the rectangular opening 36 in frame 32, the opening is bordered by a lower edge 44 (seen in FIG. 8) and opposed, curved side edges 26. Similarly, the curved cover 12 has an upper edge 46 a lower parallel edge 47 and a pair of curved side edges at the lips 39 forming the general perimeter of the cover.

The cover 12 is biased towards its open position by a coil spring 49 having its center end anchored near the axis 38 and it outer end fastened to each of the arms 40 by a fastener 50. Pivotal movement of the cover 12 from its open to its closed position is resiliently resisted by coil springs 49 and opening movement is caused by spring 49 but is dampened by a pair of viscous washers 51 at opposite ends of the cover 12. The washers 51 cause the door to move slowly from its closed to its opened position under the action of the biasing springs 49.

Figure 4:
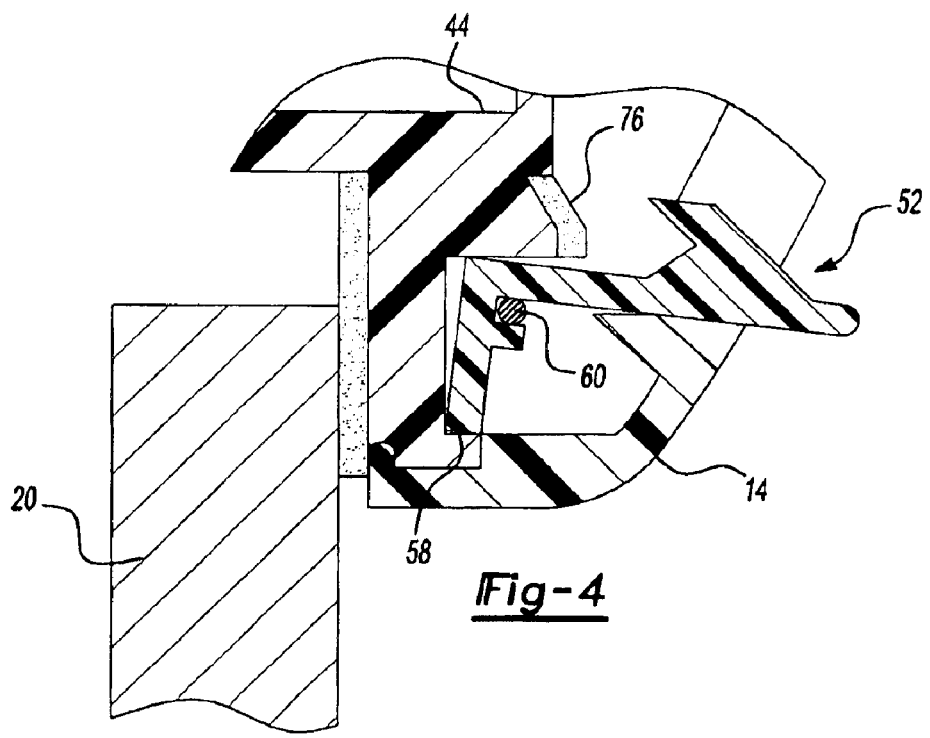
FIG. 4 is a cross-sectional view at an enlarged scale of a portion encircled in FIG. 3.
Figure 5:
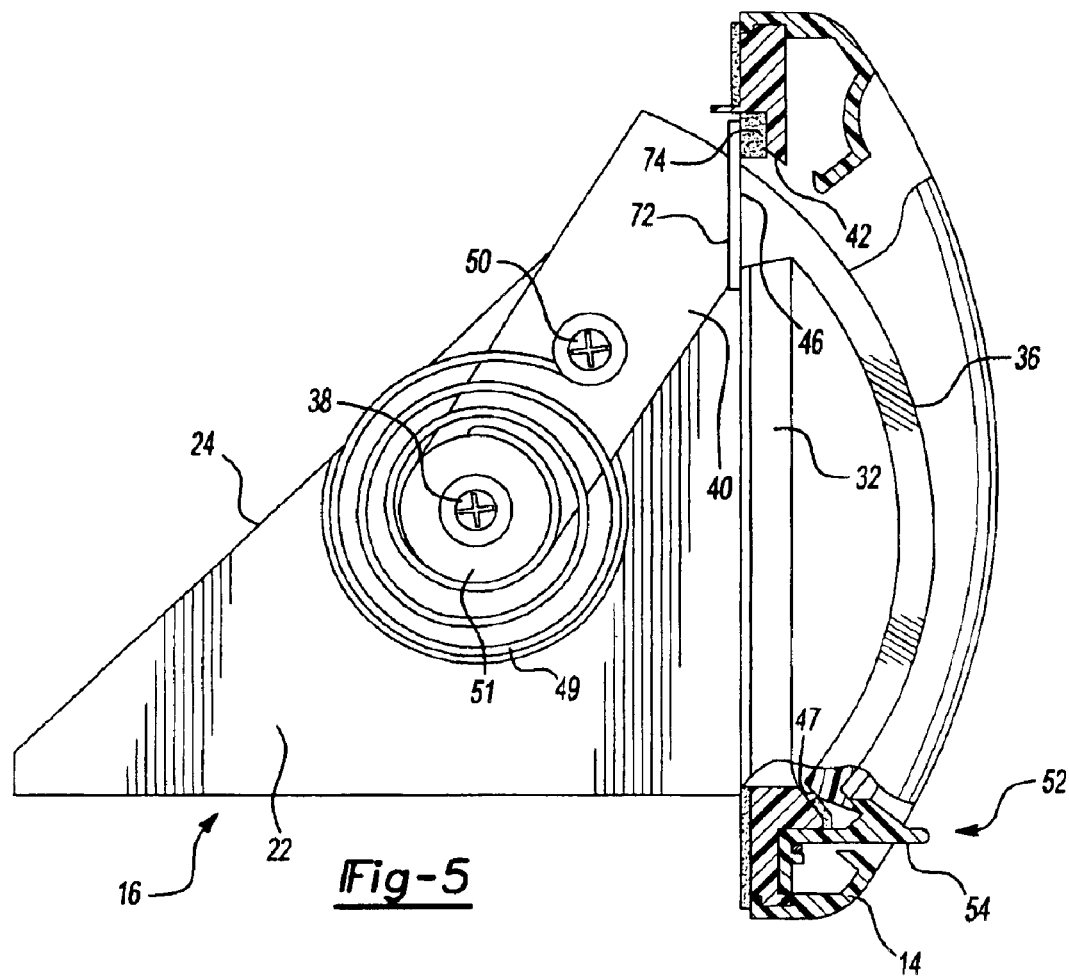
FIG. 5 is a view similar to FIG. 3 showing the cover in its closed position.
Figure 6:
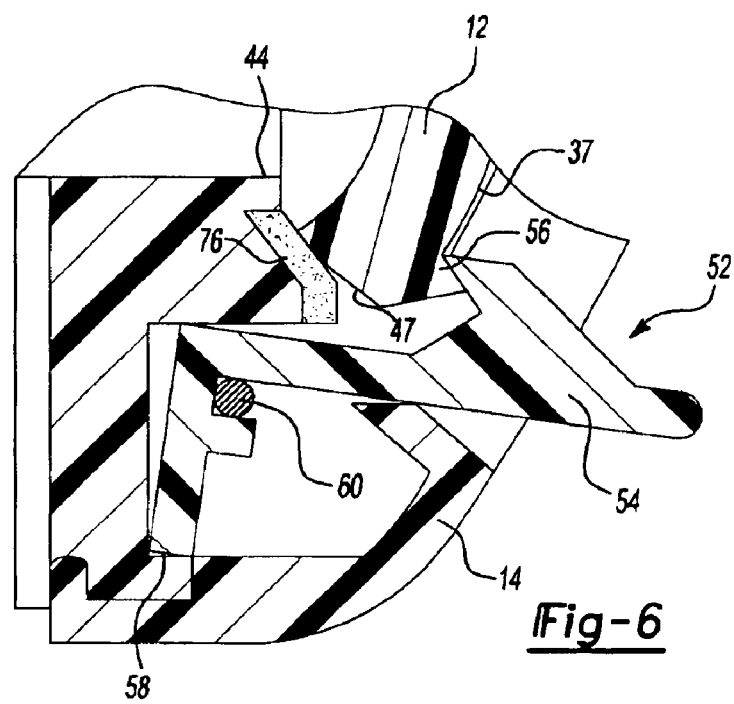
FIG. 6 is a view similar to FIG. 4 at an enlarged scale included in FIG. 5 showing mating portions of the latch structure in FIG. 5.

The cover member 12 is held in its closed position illustrated in FIG. 5 and 6 by a latch mechanism indicated generally at 52 including a handle 53 and a deflectable hook element 54 which engages the retaining ledge 56 formed on the lower edge of the face 37 of the cover member 12 as seen in FIG. 6. The hook element 54 pivots a limited amount about one end at 58 in FIGS. 4 and 6 upon downward deflection of handle 53. The latch mechanism best seen in FIGS. 3 through 6 also incorporates a leaf spring 60 seen in FIG. 8, is fastened by screws 62 to the lower part of the frame 32. Spring 60 urges the hook 52 towards and maintains it in its engaging position.

The lower edge 47 of curved cover 12 is formed with a flange 64 to opposite sides of latch 52 which acts as a handle to move the cover downwardly from its open position in FIG. 1 towards its latch engaging position as shown in FIG. 2.

Referring now to FIGS. 3 and 5, the cover member 12 is provided with a sealing flange 72 which extends across the full length of the upper edge of the face 37 and at opposite ends of the side of the arms 40. In the closed position of the cover member 12 the sealing flange 72 engages a resilient seal 74 extending across the upper edge 42 of the opening 36 at the rear of the frame 32 and downwardly at an upper portion of the side edges 45 of opening 36. In addition to the upper sealing arrangement, the lower horizontal edge 47 of the closed door 12 engages a resilient seal 76 formed on the forward surface of the frame 32 as best seen in FIG. 6.

A sealing relationship also is formed at the curved cover edges by the sliding engagement of the inside of the curved face 37 of the cover 12 and the curved edges 26 of end walls 22. The sealing relationship is enhanced by the radially extending curved sealing lips or flanges 42 seen in FIG. 8. In this manner, the entire perimeter of the moveable cover 12 is provided with sealing means which resists the passage of spray or rain to the instrument supported by the cover structure 10.

When the instrument housing 10 of the present invention is installed in a bulkhead or wall member, the marine instrument which is housed in the structure is visible with the cover member in either its open or in its closed position as seen in FIGS. 1 and 2. When the latch 52 is deflected downwardly in the position viewed in FIG. 2, the door or cover 12 is released and is urged slowly to an open position as seen in FIG. 1. Closing simply requires manual movement by pressing the handles 64 on the lower edge of the cover member 12 downwardly to the position seen in FIG. 2 which causes the latch 52 to engage and hold the cover member 12 in its closed position.

Although the cover structure has a moveable closure 16, protection is offered from sea spray and rain by a structure having seals at all four sides of rectangular opening which operate when the rotatable closure is in its closed position. The lower seal 76 extends the full width of the frame and is sealingly engaged by the lower edge 44 of the movable cover 12. The opposite curved sides or ends 48 of the cover 12 have sliding engagement with each other and additionally have protective flanges 42 which overlap to the sides of side walls 22, as seen in FIG. 8 to prevent entry of sea spray and rain. The top edge 42 of the rectangular opening 36 and end portions 43 are sealed by means of the flange 72 which form part of the movable cover and engage a seal 74 at the edge of openings 36 and 43.

Sealing protection of instruments mounted in the cover structure 10 is further enhanced by the rectangular bezel or decorative frame member which covers the front face of the mounting bracket and overlaps all four sides of the opening 36 and the cover 12.

A marine housing structure has been provided in which instruments such as radios can be protected from rain and spray by an enclosure which has a rotatable cover structure sealed around its entire perimeter against the entry of airborne water such as rain or spray, making it possible to mount marine instruments adjacent to the pilots position on smaller vessels which often are exposed to the elements.

I claim:

1. An instrument housing for installation in a wall, comprising:
   a frame for supporting an instrument and adapted for mounting in a wall, said frame having upper, lower and opposed side edges forming a rectilinear opening,
   a curved cover member having upper, lower and opposed curved side edges and shaped as a segment of a cylinder wall, said curved cover member being pivotal about the axis of said cylinder wall with said axis extending parallel spaced relationship to said upper and lower edges of said frame, said curved cover member being movable between open and closed positions relative to said frame,
   a sealing flange extending at said upper edge of said curved cover member and between said opposed side edges, and
   a sealing surface formed at said upper edge of said frame for sealing engagement with said sealing flange on said curved cover member when the latter is in a closed position.

2. The instrument housing of claim 1 wherein said lower edge of said frame and said lower edge of said curved cover member have complementary sealing surfaces engageable with each other when said curved cover member is in a closed position.

3. The instrument housing of claim 1 wherein said side edges of said frame are curved to conform to the inside surface of said curved cover member and are in abutting relationship with each other during opening and closing movement of said cover member.

4. The instrument housing of claim 1 wherein said opposed side edges of said cover member are formed with scaling lips closely spaced from said side edges of said frame in the closed position of said cover member relative to said frame.

5. The instrument housing of claim 1 wherein said segment of said cylinder wall extends between said sealing flange and said lower edge of said cover member.

6. The instrument housing of claim 5 wherein said segment extends through an arc of about 90 degrees.

7. The instrument housing of claim 1 wherein said axis of said cylinder is rearward of said frame and said segment of said wall portion is forward of said frame.

8. The instrument housing of claim 1 wherein said sealing surface of said frame faces rearwardly and said sealing surface on said cover member faces forwardly when said cover member is in a closed position.

9. The instrument housing of claim 1 and further comprising a rectangular bezel forming a rectangular opening slightly smaller than said curved cover member mounted on the outer edges of said frame.

10. An instrument housing for mounting in a generally vertical wall, comprising:

a frame forming a rectilinear opening with upper and lower edges and opposite side edges, a closure for said opening in said frame having a curved wall having its center of curvature about a longitudinal axis extending rearwardly of said frame and parallel to the upper and lower edges of said rectangular opening, said closure being rotatable between open and closed positions about said axis, a sealing flange extending at the upper edge of said closure engageable with a complementary sealing surface on the rear surface of said frame said closure moves to a closed position;

a sealing surface extending at the lower edge of said closure and engageable with a complementary sealing surface at a surface of said frame when said closure moves to a closed position; and opposite curved ends of said closure being in sliding engagement with complementary curved side edges of the opening during movement of said closure from open to closed position.

11. The instrument housing of claim 10 wherein said curved wall of said closure extends forwardly of said frame in its closed position.

12. The instrument housing of claim 10 wherein a pair of arms extend radially inwardly from opposed ends of said curved wall to said axis to support said wall for rotational movement between open and closed position.

13. The instrument housing of claim 12 wherein said arms are positioned rearwardly of said frame.

14. The instrument housing of claim 10 and further comprising latch means holding said upper and lower edges of said closure and said curved side edges of said opening in tight engagement with complementary surfaces on said frame.

* * * * *